(12) United States Patent
Li

(10) Patent No.: US 10,055,134 B2
(45) Date of Patent: Aug. 21, 2018

(54) DATA COMPRESSION METHOD AND STORAGE SYSTEM

(71) Applicant: Huawei Technologies Co., Ltd., Shenzhen (CN)

(72) Inventor: Lizhen Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 69 days.

(21) Appl. No.: 15/146,076

(22) Filed: May 4, 2016

(65) Prior Publication Data

US 2016/0246512 A1 Aug. 25, 2016

Related U.S. Application Data

(63) Continuation of application No. PCT/CN2014/079560, filed on Jun. 10, 2014.

(30) Foreign Application Priority Data

Nov. 7, 2013 (CN) .......................... 2013 1 0549672

(51) Int. Cl.
*H03M 7/30* (2006.01)
*G06F 3/06* (2006.01)
*G06F 17/30* (2006.01)

(52) U.S. Cl.
CPC .......... *G06F 3/0608* (2013.01); *G06F 3/0604* (2013.01); *G06F 3/0631* (2013.01); *G06F 3/0685* (2013.01); *G06F 17/30289* (2013.01); *H03M 7/6058* (2013.01)

(58) Field of Classification Search
CPC .... G06F 3/0604; G06F 3/0608; G06F 3/0631; G06F 17/30289; G06F 3/0626; G06F 3/0685; H03M 7/30; H03M 7/6058
See application file for complete search history.

(56) References Cited

U.S. PATENT DOCUMENTS 5,276,898 A * 1/1994 Kiel ..................... G06F 11/3409
358/1.9
6,678,828 B1 * 1/2004 Pham ..................... G06F 3/0622
726/2

(Continued)

FOREIGN PATENT DOCUMENTS

CN 102111438 A 6/2011
CN 102546782 A 7/2012

(Continued)

OTHER PUBLICATIONS

Partial English Translation and Abstract of Chinese Patent Application No. CN103631873, Apr. 29, 2016, 2 pages.

(Continued)

*Primary Examiner* — Hashem Farrokh
(74) *Attorney, Agent, or Firm* — Conley Rose, P.C.

(57) ABSTRACT

Collecting, by a metadata controller (MDC) in a storage system, first information indicating a current working status of each computing node in the storage system, and second information indicating a current working status of each storage node in the storage system, determining, by the MDC based on the first information, a computing node that is one of the computing nodes and whose current working status is not a busy state as a current active computing node, determining, by the MDC based on the second information, a storage node that is one of the storage nodes and whose current working status is not a busy state as a current active storage node, and compressing, by a distributed software header (DSH) in the current active computing node or a memory manager (MM) in the current active storage node, a piece of data when the storage system needs to compress the data.

21 Claims, 5 Drawing Sheets

(56) References Cited

U.S. PATENT DOCUMENTS

| | | | |
|---|---|---|---|
| 9,319,489 B2* | 4/2016 | Pawar | H04L 69/04 |
| 2003/0188085 A1* | 10/2003 | Arakawa | G06F 3/0605 |
| | | | 711/100 |
| 2009/0237512 A1 | 9/2009 | Liu et al. | |
| 2013/0151747 A1 | 6/2013 | Lhang et al. | |
| 2013/0275396 A1* | 10/2013 | Condict | H03M 7/30 |
| | | | 707/693 |
| 2015/0052214 A1 | 2/2015 | Zhao et al. | |

FOREIGN PATENT DOCUMENTS

| | | | |
|---|---|---|---|
| CN | 103019853 A | 4/2013 |
| CN | 103631873 A | 3/2014 |
| GB | 2500237 A | 9/2013 |

OTHER PUBLICATIONS

Joshi, N., et al., "Mechanism for Implementation of Load Balancing using Process Migration," International Journal of Computer Applications, vol. 40, No. 9, Feb. 2012, pp. 16-18.

Foreign Communication From a Counterpart Application, European Application No. 14860116.4, Extended European Search Report dated Jul. 8, 2016, 11 pages.

Foreign Communication From a Counterpart Application, PCT Application No. PCT/CN2014/079560, English Translation of International Search Report dated Sep. 3, 2014, 3 pages.

Foreign Communication From a Counterpart Application, PCT Application No. PCT/CN2014/079560, English Translation of Written Opinion dated Sep. 3, 2014, 7 pages.

* cited by examiner

DATA COMPRESSION METHOD AND STORAGE SYSTEM

CROSS-REFERENCE TO RELATED APPLICATIONS

This application is a continuation of International Application No. PCT/CN2014/079560, filed on Jun. 10, 2014, which claims priority to Chinese Patent Application No. 201310549672.3, filed on Nov. 7, 2013, both of which are hereby incorporated by reference in their entireties.

TECHNICAL FIELD

The present disclosure relates to the field of data storage technologies, and in particular, to a data compression method and a storage system.

BACKGROUND

A storage system refers to a system that includes various storage devices that store programs and data, a control component, and hardware and software that manage information scheduling in an application system.

During data storage, a storage system in the prior art generally compresses data and then stores compressed data that is obtained in order to save storage space.

The applicant of the present disclosure finds that the prior art has at least the following technical problem:

When compressing a piece of data, the storage system in the prior art cannot appropriately assign a data compression task according to a current working status of each node in the storage system, and therefore a technical problem of low compression efficiency exists. For example, if the storage system still assigns a data compression task to a control component in a node when a current working status of the node is a busy state, the control component will execute the data compression task at a very slow compression rate, and even overall performance of the storage system will be affected.

SUMMARY

Embodiments of the present application provide a data compression method and a storage system, which resolve a technical problem of low compression efficiency in the prior art that arises when a storage system cannot appropriately assign a data compression task according to a current working status of each node in the storage system during compression of a piece of data.

According to a first aspect, a data compression method is provided, including: periodically collecting, by a metadata controller (MDC) in a storage system, first information indicating a current working status of each computing node in the storage system, and second information indicating a current working status of each storage node in the storage system, determining, by the MDC based on the first information, a computing node that is one of the computing nodes and whose current working status is not a busy state as a current active computing node, and determining, by the MDC based on the second information, a storage node that is one of the storage nodes and whose current working status is not a busy state as a current active storage node, and compressing, by a distributed software header (DSH) in the current active computing node or a memory manager (MM) in the current active storage node, a piece of data when the storage system needs to compress the data.

With reference to the first aspect, in a first possible implementation manner, the first information is generated based on the following manner: determining, by a DSH in each computing node based on a current resource usage rate of at least one piece of computing node hardware in the computing node in which the DSH is located, a current working status of the computing node in which the DSH is located, and generating the first information based on the current working status of the computing node in which the DSH is located, where the computing node hardware includes a central processing unit (CPU), and/or a memory, and/or an input/output interface in the computing node, where if the current resource usage rate of the at least one piece of computing node hardware is greater than or equal to a first preset resource usage rate, the current working status of the computing node in which the at least one piece of computing node hardware is located is a busy state, or if the current resource usage rate of the at least one piece of computing node hardware is less than a first preset resource usage rate, the current working status of the computing node in which the at least one piece of computing node hardware is located is not a busy state.

With reference to the first aspect, or the first possible implementation manner of the first aspect, in a second possible implementation manner, the second information is generated based on the following manner: determining, by an MM in each storage node based on a current resource usage rate of at least one piece of storage node hardware in the storage node in which the MM is located, a current working status of the storage node in which the MM is located, and generating the second information based on the current working status of the storage node in which the MM is located, where the storage node hardware includes a CPU, and/or a memory, and/or an input/output interface in the storage node, where if the current resource usage rate of the at least one piece of storage node hardware is greater than or equal to a second preset resource usage rate, the current working status of the storage node in which the at least one piece of storage node hardware is located is a busy state, or if the current resource usage rate of the at least one piece of storage node hardware is less than a second preset resource usage rate, the current working status of the storage node in which the at least one piece of storage node hardware is located is not a busy state.

With reference to the first aspect, or the first possible implementation manner of the first aspect, or the second possible implementation manner of the first aspect, in a third possible implementation manner, the method further includes: generating, by the MDC, a current active node list that records the current active computing node and the current active storage node.

With reference to the third possible implementation manner of the first aspect, in a fourth possible implementation manner, after the generating, by the MDC, a current active node list that records the current active computing node and the current active storage node, the method further includes: acquiring, by a first DSH in a first computing node, the data when the storage system needs to compress the data, where an application program corresponding to the data is deployed in the first computing node, acquiring, by the first DSH, the current active node list, and determining whether the current active node list records the first computing node, and when the current active node list records the first computing node, compressing, by the first DSH, the data to obtain compressed data.

With reference to the fourth possible implementation manner of the first aspect, in a fifth possible implementation manner, after the acquiring, by the first DSH, the current active node list, and determining whether the current active node list records the first computing node, the method further includes: when the current active node list does not record the first computing node, adding, by the first DSH to the data, a label indicating that the data is not compressed in order to obtain labeled data, determining, by the first DSH, whether the current active node list records a first storage node, where a memory that is configured to store the data and a first MM that is configured to manage the memory are disposed in the first storage node, and sending, by the first DSH, the labeled data to the first MM when the current active node list records the first storage node.

With reference to the fifth possible implementation manner of the first aspect, in a sixth possible implementation manner, after the determining, by the first DSH, whether the current active node list records a first storage node, the method further includes: when the current active node list does not record the first storage node, determining, by the first DSH, whether the current active node list records a second computing node, where the second computing node is any computing node except the first computing node, and sending, by the first DSH, the labeled data to a second DSH in the second computing node when the current active node list records the second computing node such that the second DSH compresses the data to obtain the compressed data, or sending, by the first DSH, the labeled data to the first MM when the current active node list does not record the second computing node.

With reference to the fifth possible implementation manner of the first aspect, or the sixth possible implementation manner of the first aspect, in a seventh possible implementation manner, after the sending, by the first DSH, the labeled data to the first MM, the method further includes: receiving, by the first MM, the labeled data, acquiring, by the first MM, the data and the label from the labeled data, determining, by the first MM based on the label, whether a current working status of the first storage node is a busy state, and when the current working status of the first storage node is not a busy state, compressing, by the first MM, the data to obtain the compressed data.

With reference to the seventh possible implementation manner of the first aspect, in an eighth possible implementation manner, after the determining, by the first MM based on the label, whether a current working status of the first storage node is a busy state, the method further includes: directly storing, by the first MM, the data in the memory when the current working status of the first storage node is a busy state, and sending, by the first MM to the first DSH, third information indicating that the data is not compressed.

With reference to the eighth possible implementation manner of the first aspect, in a ninth possible implementation manner, after the sending, by the first MM to the first DSH, third information indicating that the data is not compressed, the method further includes: receiving, by the first DSH, the third information, and acquiring, by the first DSH based on the third information, the current active node list, and sending a first request to the first MM when the current active node list records the first storage node, where the first request is used to enable the first MM to acquire the data from the memory and compress the data to obtain the compressed data.

Based on a same inventive concept, according to a second aspect, a storage system is provided, including: N computing nodes, where at least one distributed software header DSH is disposed in each computing node of the N computing nodes, and N is a positive integer, P storage nodes, where at least one memory manager MM is disposed in each storage node of the P storage nodes, and P is a positive integer, and at least one metadata controller MDC, separately connected to the N computing nodes and separately connected to the P storage nodes, where the MDC is configured to periodically collect first information indicating a current working status of each computing node, and second information indicating a current working status of each storage node, determine, based on the first information, a computing node that is one of the computing nodes and whose current working status is not a busy state as a current active computing node, and determine, based on the second information, a storage node that is one of the storage nodes and whose current working status is not a busy state as a current active storage node, where a DSH in the current active computing node or an MM in the current active storage node compresses a piece of data when the storage system needs to compress the data.

With reference to the second aspect, in a first possible implementation manner, each DSH in the N computing nodes is configured to: determine, based on a current resource usage rate of at least one piece of computing node hardware in the computing node in which the DSH is located, a current working status of the computing node in which the DSH is located, and generate the first information based on the current working status of the computing node in which the DSH is located, where the computing node hardware includes a CPU, and/or a memory, and/or an input/output interface in the computing node, where if the current resource usage rate of the at least one piece of computing node hardware is greater than or equal to a first preset resource usage rate, the current working status of the computing node in which the at least one piece of computing node hardware is located is a busy state, or if the current resource usage rate of the at least one piece of computing node hardware is less than a first preset resource usage rate, the current working status of the computing node in which the at least one piece of computing node hardware is located is not a busy state.

With reference to the second aspect, or the first possible implementation manner of the second aspect, in a second possible implementation manner, each MM in the P storage nodes is configured to: determine, based on a current resource usage rate of at least one piece of storage node hardware in the storage node in which the MM is located, a current working status of the storage node in which the MM is located, and generate the second information based on the current working status of the storage node in which the MM is located, where the storage node hardware includes a CPU, and/or a memory, and/or an input/output interface in the storage node, where if the current resource usage rate of the at least one piece of storage node hardware is greater than or equal to a second preset resource usage rate, the current working status of the storage node in which the at least one piece of storage node hardware is located is a busy state, or if the current resource usage rate of the at least one piece of storage node hardware is less than a second preset resource usage rate, the current working status of the storage node in which the at least one piece of storage node hardware is located is not a busy state.

With reference to the second aspect, or the first possible implementation manner of the second aspect, or the second possible implementation manner of the second aspect, in a third possible implementation manner, the MDC is further configured to: generate a current active node list that records the current active computing node and the current active storage node.

With reference to the third possible implementation manner of the second aspect, in a fourth possible implementation manner, the N computing nodes include a first computing node, and an application program corresponding to the data is deployed in the first computing node, and the first computing node includes a first DSH, where the first DSH is configured to: acquire the data when the storage system needs to compress the data, acquire the current active node list, and determine whether the current active node list records the first computing node, and when the current active node list records the first computing node, compress the data to obtain compressed data.

With reference to the fourth possible implementation manner of the second aspect, in a fifth possible implementation manner, the P storage nodes include a first storage node, and a memory that is configured to store the data and a first MM that is configured to manage the memory are disposed in the first storage node, and in this case, the first DSH is further configured to: when the current active node list does not record the first computing node, add a label indicating that the data is not compressed to the data in order to obtain labeled data, determine whether the current active node list records the first storage node, and send the labeled data to the first MM when the current active node list records the first storage node.

With reference to the fifth possible implementation manner of the second aspect, in a sixth possible implementation manner, the first DSH is further configured to: when the current active node list does not record the first storage node, determine whether the current active node list records a second computing node, where the second computing node is any computing node except the first computing node, and send the labeled data to a second DSH in the second computing node when the current active node list records the second computing node such that the second DSH compresses the data to obtain the compressed data, or send the labeled data to the first MM when the current active node list does not record the second computing node.

With reference to the fifth possible implementation manner of the second aspect, or the sixth possible implementation manner of the second aspect, in a seventh possible implementation manner, the first MM is configured to: receive the labeled data, acquire the data and the label from the labeled data, determine, based on the label, whether a current working status of the first storage node is a busy state, and when the current working status of the first storage node is not a busy state, compress the data to obtain the compressed data.

With reference to the seventh possible implementation manner of the second aspect, in an eighth possible implementation manner, the first MM is further configured to: directly store the data in the memory when the current working status of the first storage node is a busy state, and send, to the first DSH, third information indicating that the data is not compressed.

With reference to the eighth possible implementation manner of the second aspect, in a ninth possible implementation manner, the first DSH is further configured to: receive the third information, acquire the current active node list based on the third information, and send a first request to the first MM when the current active node list records the first storage node, where the first request is used to enable the first MM to acquire the data from the memory and compress the data to obtain the compressed data. Beneficial effects of the present disclosure are as follows:

In the data compression method provided by the first aspect and the storage system provided by the second aspect, the storage system uses a MDC to periodically collect first information indicating a current working status of each computing node in the storage system, and second information indicating a current working status of each storage node in the storage system, based on the first information, a computing node that is one of the computing nodes and whose current working status is not a busy state is determined as a current active computing node, based on the second information, a storage node that is one of the storage nodes and whose current working status is not a busy state is determined as a current active storage node, and a DSH in the current active computing node or a MM in the current active storage node compresses a piece of data when the storage system needs to compress the data. In this way, the technical problem of low compression efficiency in the prior art is effectively resolved, where the problem arises when a storage system cannot appropriately assign a data compression task according to a current working status of each node in the storage system during compression of a piece of data. The following technical effect is achieved according to the current working status of each node in the storage system, data compression is performed by a control component in a node in a non-busy state, thereby increasing data compression efficiency.

DESCRIPTION OF EMBODIMENTS

Figure 1:
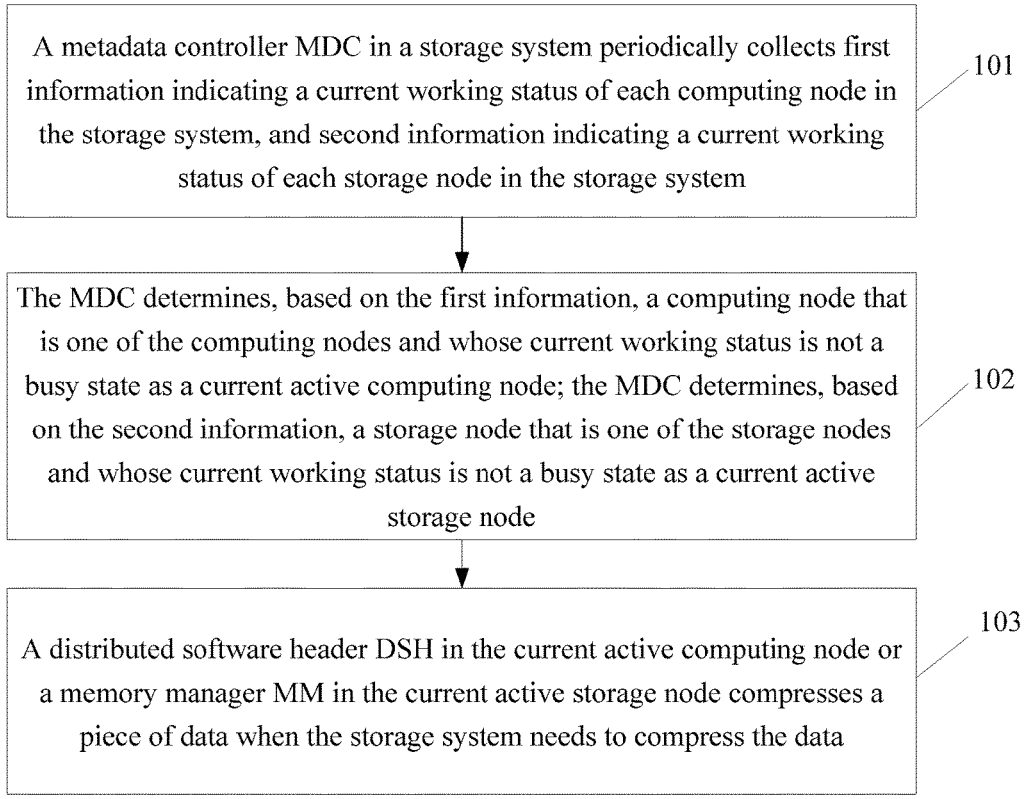
FIG. 1 is a flowchart of a data compression method according to an embodiment of the present application.

Embodiments of the present application provide a data compression method and a storage system, which resolve a technical problem of low compression efficiency in the prior art that arises when a storage system cannot appropriately assign a data compression task according to a current working status of each node in the storage system during compression of a piece of data.

To resolve the foregoing technical problem, a general idea of technical solutions in the embodiments of the present application are as follows:

A data compression method is provided, including periodically collecting, by a MDC in a storage system, first information indicating a current working status of each computing node in the storage system, and second information indicating a current working status of each storage node in the storage system, determining, by the MDC based on the first information, a computing node that is one of the computing nodes and whose current working status is not a busy state as a current active computing node, and determining, by the MDC based on the second information, a storage node that is one of the storage nodes and whose current working status is not a busy state as a current active storage node, and compressing, by a DSH in the current active computing node or a MM in the current active storage node, a piece of data when the storage system needs to compress the data.

In a storage system in the present application, a MDC periodically collects first information indicating a current working status of each computing node in the storage system, and second information indicating a current working status of each storage node in the storage system, based on the first information, a computing node that is one of the computing nodes and whose current working status is not a busy state is determined as a current active computing node, based on the second information, a storage node that is one of the storage nodes and whose current working status is not a busy state is determined as a current active storage node, and a DSH in the current active computing node or a MM in the current active storage node compresses a piece of data when the storage system needs to compress the data. In this way, the technical problem of low compression efficiency in the prior art is effectively resolved, where the problem arises when a storage system cannot appropriately assign a data compression task according to a current working status of each node in the storage system during compression of a piece of data. The following technical effect is achieved according to the current working status of each node in the storage system, data compression is performed by a control component in a node in a non-busy state, thereby increasing data compression efficiency.

To make the objectives, technical solutions, and advantages of an embodiment of the present application more clearly, the following clearly describes the technical solutions in the embodiments of the present application with reference to the accompanying drawings in the embodiments of the present application. The described embodiments are merely some but not all of the embodiments of the present application. All other embodiments obtained by persons of ordinary skill in the art based on the embodiments of the present application without creative efforts shall fall within the protection scope of the present disclosure.

Embodiment 1

This embodiment of the present application provides a data compression method, and before the data compression method in this embodiment of the present application is introduced, a storage system to be mentioned in this embodiment of the present application is introduced.

Figure 4:
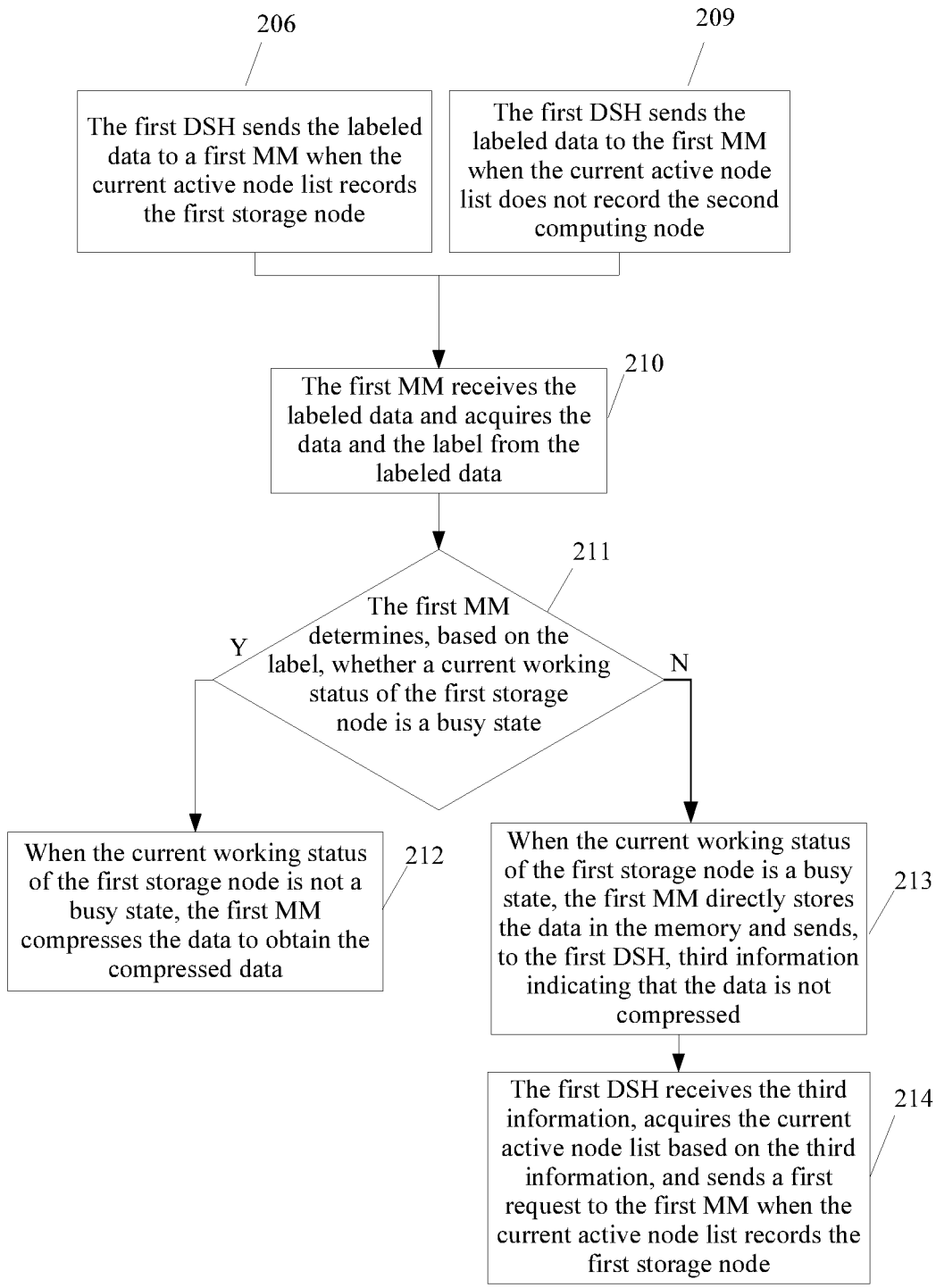

As shown in FIG. 4, the storage system includes multiple storage nodes and multiple (cloud) computing nodes, where at least one DSH is disposed in each computing node, and the DSH can execute tasks of data compression and data decompression. One or more memories are disposed in each storage node, where each storage node is corresponding to one MM, and the MM can execute tasks of data storage, data reading, data compression, and data decompression. One or more MDCs are deployed in the storage nodes of the storage system.

In a specific implementation process, the memory in the storage node may be one of a non-volatile random-access memory (NVRAM), a static random-access memory (SRAM), a flash memory, and the like, and/or one of a magnetic disk, a floppy disk, a magnetic tape, and the like. Because the memories may be different devices, correspondingly, the MMs that are configured to manage the memories are also different. For example, when the memory is a magnetic disk (DISK), the MM is correspondingly a disk manager (DM).

In a specific implementation process, each computing node and each storage node in the storage system are connected in a memory interaction network such that each computing node may access any other computing node or storage node.

As shown in FIG. 1, the data compression method in this embodiment of the present application includes:

Step 101 A MDC in a storage system periodically collects first information indicating a current working status of each computing node in the storage system, and second information indicating a current working status of each storage node in the storage system. In a specific implementation process, a DSH in each computing node in the storage system performs calculation according to a current status of a CPU, a memory, and a network interface of the computing node in which the DSH is located, and according to a pressure status of input/output (I/O) under the charge of the DSH, determines whether a current working status of the computing node in which the DSH is located is a busy state, and generates the first information indicating the current working status of each computing node.

Step 102 The MDC determines, based on the first information, a computing node that is one of the computing nodes and whose current working status is not a busy state as a current active computing node. The MDC further determines, based on the second information, a storage node that is one of the storage nodes and whose current working status is not a busy state as a current active storage node. In a specific implementation process, an MM in each storage node in the storage system performs calculation according to a current status of a CPU, a memory, and a network interface of the storage node in which the MM is located, and according to a pressure status of I/O under the charge of the MM, determines whether a current working status of the storage node in which the MM is located is a busy state, and generates the second information indicating the current working status of each storage node.

Figure 5:
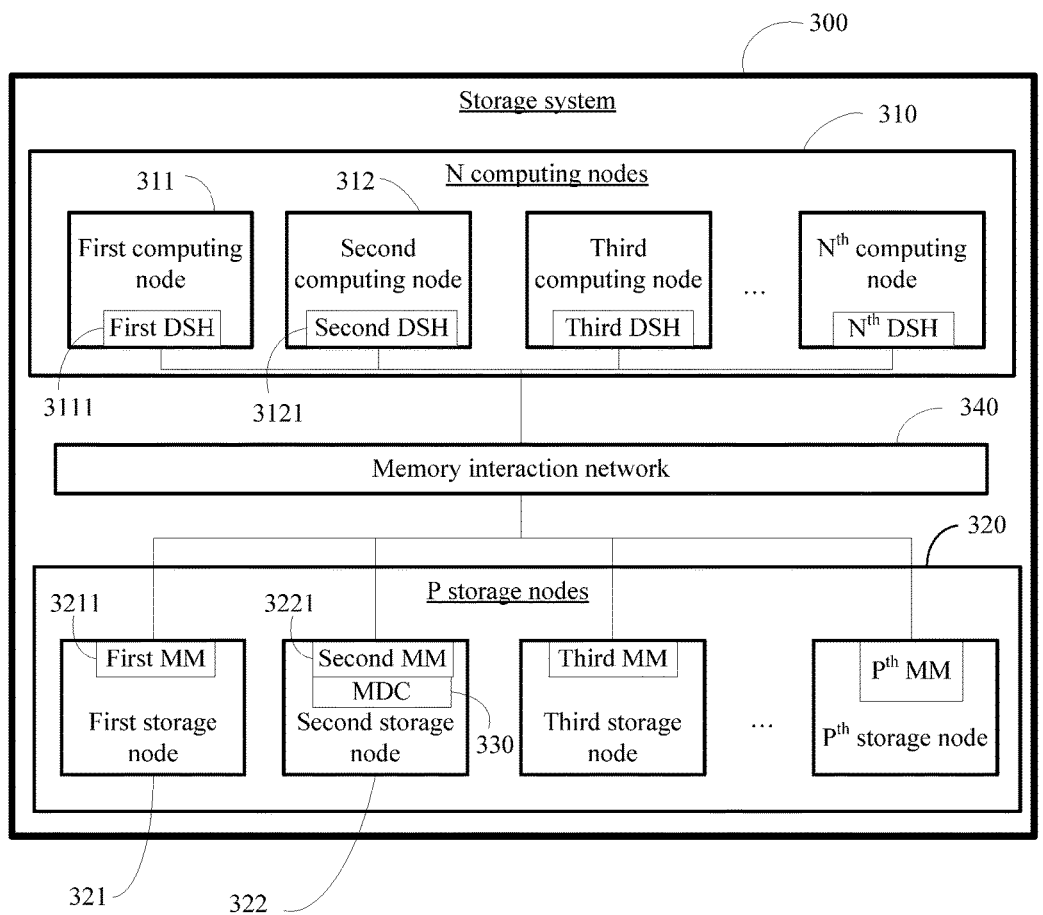
FIG. 5 is a schematic diagram of a structure of a storage system according to an embodiment of the present application.

Step 103 A DSH in the current active computing node or a MM in the current active storage node compresses a piece of data when the storage system needs to compress the data. For example, as shown in FIG. 5, if a first computing node 311 and a second computing node 312 are determined as current active computing nodes, and a first storage node 321 and a second storage node 322 are determined as current active storage nodes, then a first DSH 3111 in the first computing node 311, or a second DSH 3121 in the second computing node 321, or a first MM 3211 in the first storage node 321, or a second MM (3221 in the second storage node 322 executes a data compression task when the storage system needs to execute the data compression task.

In this embodiment of the present application, in the storage system, the computing node whose current working status is not a busy state is determined as the current active computing node, and the storage node whose current working status is not a busy state is determined as the current active storage node, when the storage system needs to compress a piece of data, the distributed software header DSH in the current active computing node or the MM in the current active storage node compresses the data. In this way, a technical problem of low compression efficiency in the prior art is effectively resolved, where the problem arises when a storage system cannot appropriately assign a data compression task according to a current working status of each node in the storage system during compression of a piece of data. The following technical effect is achieved according to the current working status of each node in the storage system. Data compression is performed by a control component in a node in a non-busy state, thereby increasing data compression efficiency.

In this embodiment of the present application, optionally, the first information is generated based on the following manner:

A DSH in each computing node determines, based on a current resource usage rate of at least one piece of computing node hardware in the computing node in which the DSH is located, a current working status of the computing node in which the DSH is located, and generates the first information based on the current working status of the computing node in which the DSH is located, where the computing node hardware includes a CPU, and/or a memory, and/or an input/output interface in the computing node, where if the current resource usage rate of the at least one piece of computing node hardware is greater than or equal to a first preset resource usage rate, the current working status of the computing node in which the at least one piece of computing node hardware is located is a busy state, or if the current resource usage rate of the at least one piece of computing node hardware is less than a first preset resource usage rate, the current working status of the computing node in which the at least one piece of computing node hardware is located is not a busy state.

For example, a first DSH in a first computing node first determines whether a current resource usage rate of a CPU or a memory in the first computing node is greater than or equal to a preset resource usage rate a1 (a1 is a constant and may be adaptively adjusted according to a running status of a storage system). If the current resource usage rate of the CPU or the memory in the first computing node is greater than or equal to the preset resource usage rate a1, the first DSH determines that a current working status of the first computing node is a busy state, if the current resource usage rate of the CPU or the memory in the first computing node is less than the preset resource usage rate a1, the first DSH further determines whether a resource usage rate of bandwidth or an I/O interface in the first computing node is greater than or equal to a preset resource usage rate b1 (b1 is a constant and may be adaptively adjusted according to the running status of the storage system). If the resource usage rate of the bandwidth or the I/O interface in the first computing node is greater than or equal to the preset resource usage rate b1, the first DSH determines that the current working status of the first computing node is a busy state, if the resource usage rate of the bandwidth or the I/O interface in the first computing node is less than the preset resource usage rate b1, the first DSH determines that the current working status of the first computing node is not a busy state.

In this embodiment of the present application, optionally, the second information is generated based on the following manner:

An MM in each storage node determines, based on a current resource usage rate of at least one piece of storage node hardware in the storage node in which the MM is located, a current working status of the storage node in which the MM is located, and generates the second information based on the current working status of the storage node in which the MM is located, where the storage node hardware includes a CPU, and/or a memory, and/or an input/output interface in the storage node, where if the current resource usage rate of the at least one piece of storage node hardware is greater than or equal to a second preset resource usage rate, the current working status of the storage node in which the at least one piece of storage node hardware is located is a busy state, or if the current resource usage rate of the at least one piece of storage node hardware is less than a second preset resource usage rate, the current working status of the storage node in which the at least one piece of storage node hardware is located is not a busy state.

For example, a first MM first in a first storage node first determines whether a current resource usage rate of a CPU or a memory in the first storage node is greater than or equal to a preset resource usage rate a2 (a2 is a constant and may be adaptively adjusted according to a running status of a storage system). If the current resource usage rate of the CPU or the memory in the first storage node is greater than or equal to the preset resource usage rate a2, the first MM determines that a current working status of the first storage node is a busy state, if the current resource usage rate of the CPU or the memory in the first storage node is less than the preset resource usage rate a2, the first MM further determines whether a resource usage rate of bandwidth or an I/O interface in the first storage node is greater than or equal to a preset resource usage rate b2 (b2 is a constant and may be adaptively adjusted according to the running status of the storage system). If the resource usage rate of the bandwidth or the I/O interface in the first storage node is greater than or equal to the preset resource usage rate b2, the first MM determines that the current working status of the first storage node is a busy state, if the resource usage rate of the bandwidth or the I/O interface in the first storage node is less than the preset resource usage rate b2, the first MM determines that the current working status of the first storage node is not a busy state.

In this embodiment of the present application, optionally, the data compression method further includes:

The MDC generates a current active node list that records the current active computing node and the current active storage node. In a specific implementation process, the MDC may send the current active node list to the DSH in each computing node in the storage system such that each DSH learns a computing node and a storage node whose current working statuses are not busy.

Figure 2:
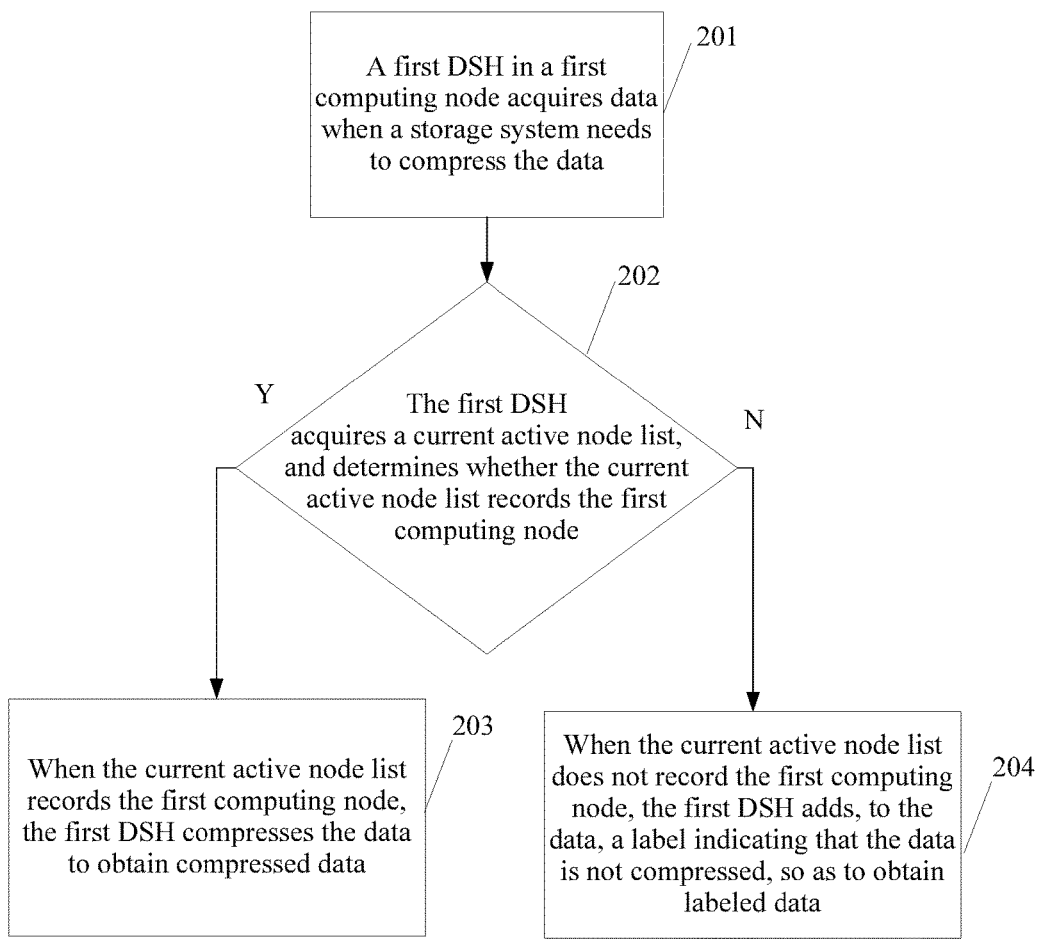
FIG. 2, FIG. 3, and FIG. 4 are detailed flowcharts of step 103 in an embodiment of the present application.

As shown in FIG. 2, in this embodiment of the present application, optionally, step 103 includes:

Step 201: A first DSH in a first computing node acquires the data when the storage system needs to compress the data. An application program corresponding to the data is deployed in the first computing node. In a specific implementation process, when the application program in the first computing node needs to store a piece of data using the storage system, the first DSH in the first computing node acquires the data.

Step 202: The first DSH acquires a current active node list, and determines whether the current active node list records the first computing node. In a specific implementation process, the first DSH determines whether a current working status of the first computing node is a busy state using the current active node list.

Step 203: When the current active node list records the first computing node, the first DSH compresses the data to obtain compressed data. In a specific implementation process, when the current active node list records the first computing node, it indicates that the current working status of the first computing node is not a busy state, and in this case, the first DSH executes a compression task on the data. After obtaining the compressed data, the first DSH sends the compressed data to a first MM in a first storage node such that the first MM stores the compressed data in a corresponding memory, where the memory that is configured to store the data and the first MM that is configured to manage the memory are disposed in the first storage node.

In this embodiment of the present application, the first DSH executes the data compression task on a premise that the first DSH learns that the current working status of the first computing node is not a busy state. Therefore, a technical problem of deterioration of overall performance of the storage system is avoided, where the problem arises when the first computing node executes the data compression task in the case of insufficient resources, and a technical effect of ensuring that the overall performance of the storage system is not affected by the compression task is achieved.

As shown in FIG. 2, in this embodiment of the present application, optionally, after step 202, the data compression method further includes:

Step 204: When the current active node list does not record the first computing node, the first DSH adds, to the data, a label indicating that the data is not compressed in order to obtain labeled data such that a control component in another node in the storage system may obtain the label and the data from the labeled data after obtaining the labeled data, and learn, according to the label, that the data is not compressed.

In a specific implementation process, optionally, after step 204, the data compression method further includes:

The first DSH determines whether the current active node list records a second computing node (the second computing node is any computing node except the first computing node). If the current active node list records the second computing node, the first DSH sends the labeled data to the second computing node such that a second DSH in the second computing node compresses the data, if the current active node list does not record the second, the first DSH sends the labeled data to the first storage node (the memory that is configured to store the data is deployed in the first storage node) such that the first MM in the first storage node compresses the data.

Figure 3:
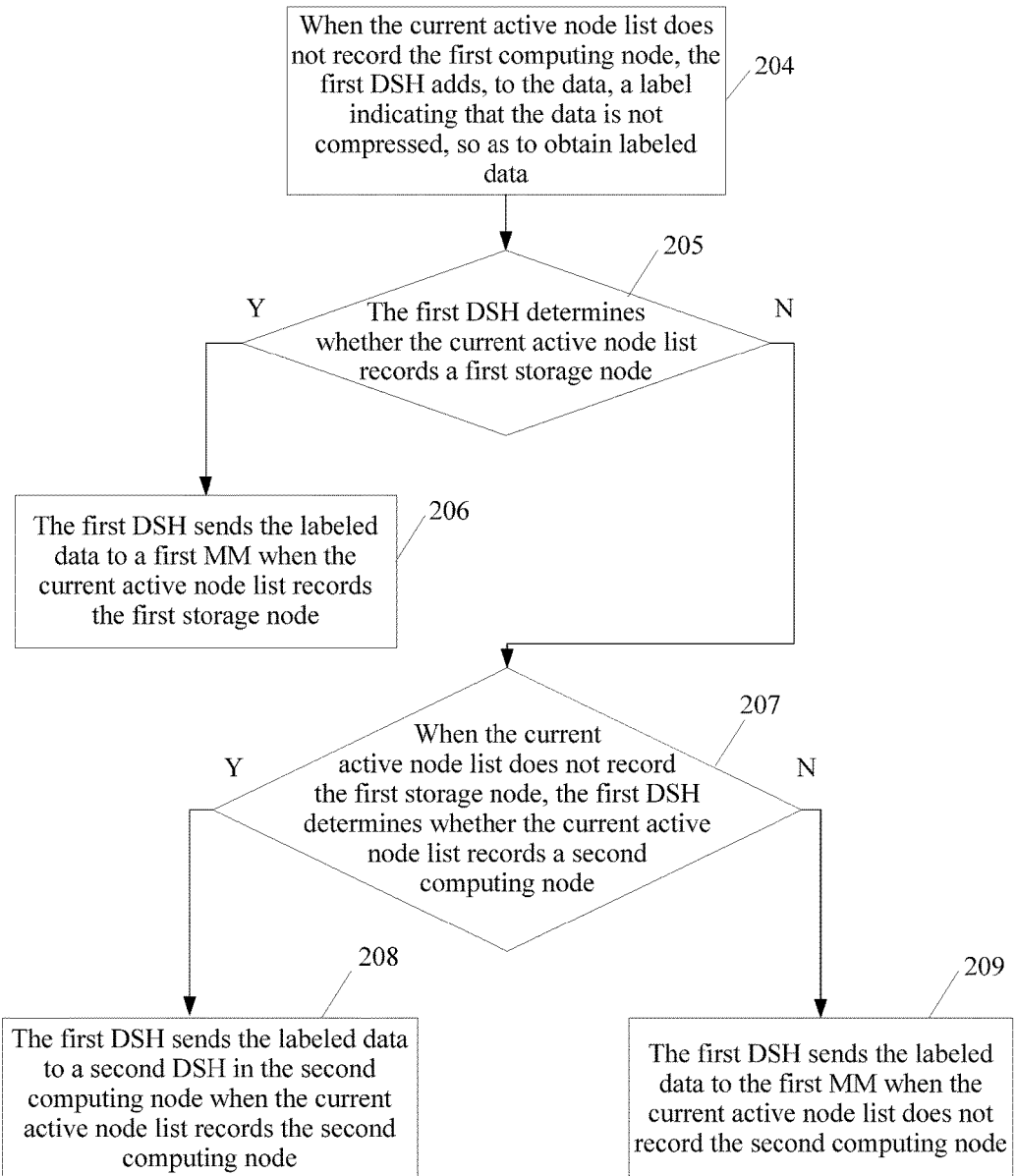

As shown in FIG. 3, in this embodiment of the present application, optionally, after step 204, the data compression method further includes:

Step 205: The first DSH determines whether the current active node list records a first storage node, where a memory that is configured to store data and a first MM that is configured to manage the memory are disposed in the first storage node.

Step 206: The first DSH sends the labeled data to the first MM when the current active node list records the first storage node such that the first MM compresses the data.

In this embodiment of the present application, the first DSH transfers the compression task on the data to the first MM in the first storage node when learning that the current working status of the first computing node is a busy state. Therefore, the technical problem of degradation of overall performance of the storage system is avoided, where the problem arises when the first computing node executes the data compression task in the case of insufficient resources, and the technical effect of ensuring that the overall performance of the storage system is not affected by the compression task is achieved.

As shown in FIG. 3, in this embodiment of the present application, optionally, after step 205, the data compression method further includes:

Step 207: When the current active node list does not record the first storage node, the first DSH determines whether the current active node list records a second computing node, where the second computing node is any computing node except the first computing node.

Step 208: The first DSH sends the labeled data to a second DSH in the second computing node when the current active node list records the second computing node such that the second DSH compresses the data to obtain the compressed data.

In this embodiment of the present application, the first DSH transfers the compression task on the data to the second DSH in the second computing node in a non-busy state when learning that the current working status of the first computing node is a busy state. Therefore, the technical problem of degradation of overall performance of the storage system is avoided, where the problem arises when the first computing node executes the data compression task in the case of insufficient resources, and the technical effect of ensuring that the overall performance of the storage system is not affected by the compression task is achieved.

In this embodiment of the present application, optionally, as shown in FIG. 3, after step 207, the data compression method further includes:

Step 209: The first DSH sends the labeled data to the first MM when the current active node list does not record the second computing node such that the first MM compresses the data, or directly stores the data.

As shown in FIG. 4, in this embodiment of the present application, optionally, after step 206 or step 209, the data compression method further includes:

Step 210: The first MM receives the labeled data and acquires the data and the label from the labeled data, where the label is used to indicate that the data is not compressed. In a specific implementation process, when obtaining the label from the labeled data, the first MM learns that the data is not compressed.

Step 211: The first MM determines, based on the label, whether a current working status of the first storage node is a busy state. In a specific implementation process, a relatively long delay may occur when the first computing node and the first storage node communicate using the memory interaction network, and consequently the current working status of the first storage node has changed when the first MM receives the labeled data. In this case, preferably, the first MM needs to determine again whether the current working status of the first storage node is a busy state.

In a specific implementation process, the first MM determines whether the current working status of the first storage node is a busy state according to a current status of a CPU, a memory, and a network interface of the first storage node in which the first MM is located, and according to a pressure status of I/O under the charge of the first MM.

Step 212: When the current working status of the first storage node is not a busy state, the first MM compresses the data to obtain the compressed data. After obtaining the compressed data, the first MM stores the compressed data in a corresponding memory.

In this embodiment of the present application, when the first MM obtains the labeled data and learns that the data is not compressed, the first MM compresses the data on a premise that the first MM determines that the current working status of the first storage node in which the first MM is located is a non-busy state. Therefore, the technical problem of degradation of overall performance of the storage system is avoided, where the problem arises when the first storage node executes the data compression task in the case of insufficient resources, and the technical effect of ensuring that the overall performance of the storage system is not affected by the compression task is achieved.

As shown in FIG. 4, in this embodiment of the present application, optionally, after step 211, the data compression method further includes:

Step 213: When the current working status of the first storage node is a busy state, the first MM directly stores the data in the memory and sends, to the first DSH, third information indicating that the data is not compressed.

In this embodiment of the present application, the first MM directly stores the data when learning that the first storage node in which the first MM is located is in a busy state. Therefore, the technical problem of degradation of overall performance of the storage system is avoided, where the problem arises when the first storage node executes the data compression task in the case of insufficient resources, and the technical effect of ensuring that the overall performance of the storage system is not affected by the compression task is achieved.

As shown in FIG. 4, in this embodiment of the present application, optionally, after step 213, the data compression method further includes:

Step 214: The first DSH receives the third information, acquires the current active node list based on the third information, and sends a first request to the first MM when the current active node list records the first storage node. The first request is used to enable the first MM to acquire the data from the memory and compress the data to obtain the compressed data.

In this embodiment of the present application, when the first DSH learns that the data is not compressed but is directly stored, the first DSH chooses to send the first request to the first MM when the first storage node is in a non-busy state such that the first MM acquires the data from the memory and compresses the data to obtain the compressed data, and then stores the compressed data that is obtained, thereby achieving a technical effect of saving a memory resource in the first storage node.

In addition, in this embodiment of the present application, the storage system uses a "delayed compression" manner, that is when the first storage node is currently in a busy state, the storage system first uses the first MM to store the data, then uses the first DSH to detect the current working status of the first storage node, and then enables the first MM to compress the data when the current working status of the first storage node is a non-busy state. Therefore, the technical problem of degradation of overall performance of the storage system is avoided, where the problem arises when the first storage node executes the data compression task in the case of insufficient resources, and the technical effect of ensuring that the overall performance of the storage system is not affected by the compression task is achieved.

In this embodiment of the present application, optionally, when an application program in the first storage node needs to read the data, the first MM first acquires, from the memory, the compressed data of the data, and then the first MM determines whether the current working status of the first storage node is a busy state. If the current working status of the first storage node is not a busy state, the first MM decompresses the compressed data, if the current working status of the first storage node is a busy state, the first MM sends the compressed data to the first DSH in a first computing node such that the first DSH decompresses the compressed data.

In this embodiment of the present application, the first MM transfers the decompression task to the first DSH when learning that the first storage node in which the first MM is located is in a busy state. Therefore, the technical problem of degradation of overall performance of the storage system is avoided, where the problem arises when the first storage node executes the data decompression task in the case of insufficient resources, and the technical effect of ensuring that the overall performance of the storage system is not affected by the decompression task is achieved.

Embodiment 2

Based on a same design concept, this embodiment of the present application further provides a storage system that is configured to implement the data compression method in Embodiment 1.

As shown in FIG. 5, a storage system 300 is provided, including: N computing nodes 310, where at least one DSH is disposed in each computing node of the N computing nodes 310, and N is a positive integer, P storage nodes 320, where at least one MM is disposed in each storage node of the P storage nodes 320, and P is a positive integer, and at least one MDC 330, separately connected to the N computing nodes 310 and separately connected to the P storage nodes 320, where the MDC 330 is configured to periodically collect first information indicating a current working status of each computing node, and second information indicating a current working status of each storage node, determine, based on the first information, a computing node that is one of the computing nodes and whose current working status is not a busy state as a current active computing node, and determine, based on the second information, a storage node that is one of the storage nodes and whose current working status is not a busy state as a current active storage node.

A DSH in the current active computing node or an MM in the current active storage node compresses a piece of data when the storage system 300 needs to compress the data.

In a specific implementation process, the storage system 300 may include one or more MDCs 330, and a location of the MDC 330 may be arbitrarily chosen, for example, in a first storage node 321) or in a second storage node 322, or in a first computing node 311, or in a second computing node 312.

In this embodiment of the present application, optionally, each DSH in the N computing nodes 310 is configured to determine, based on a current resource usage rate of at least one piece of computing node hardware in the computing node in which the DSH is located, a current working status of the computing node in which the DSH is located, and generate the first information based on the current working status of the computing node in which the DSH is located, where the computing node hardware includes a CPU, and/or a memory, and/or an I/O interface in the computing node, where if the current resource usage rate of the at least one piece of computing node hardware is greater than or equal to a first preset resource usage rate, the current working status of the computing node in which the at least one piece of computing node hardware is located is a busy state, or if the current resource usage rate of the at least one piece of computing node hardware is less than a first preset resource usage rate, the current working status of the computing node in which the at least one piece of computing node hardware is located is not a busy state.

In this embodiment of the present application, optionally, each MM in the P storage nodes 320 is configured to determine, based on a current resource usage rate of at least one piece of storage node hardware in the storage node in which the MM is located, a current working status of the storage node in which the MM is located, and generate the second information based on the current working status of the storage node in which the MM is located, where the storage node hardware includes a CPU, and/or a memory, and/or an I/O interface in the storage node, where if the current resource usage rate of the at least one piece of storage node hardware is greater than or equal to a second preset resource usage rate, the current working status of the storage node in which the at least one piece of storage node hardware is located is a busy state, or if the current resource usage rate of the at least one piece of storage node hardware is less than a second preset resource usage rate, the current working status of the storage node in which the at least one piece of storage node hardware is located is not a busy state.

In this embodiment of the present application, optionally, the storage system 300 further includes a memory interaction network 340 configured to connect each storage node and each computing node such that each storage node and each computing node may access each other.

In this embodiment of the present application, optionally, the MDC 330 is further configured to generate a current active node list that records the current active computing node and the current active storage node.

In this embodiment of the present application, optionally, the N computing nodes 310 include the first computing node 311, and an application program corresponding to the data is deployed in the first computing node 311, the first computing node 311 includes a first DSH 3111, where the first DSH 3111 is configured to acquire the data when the storage system 300 needs to compress the data, acquire the current active node list and determine whether the current active node list records the first computing node 311, and when the current active node list records the first computing node 311, compress the data to obtain compressed data.

In this embodiment of the present application, optionally, the P storage nodes 320 include the first storage node 321, and a memory that is configured to store the data and a first MM 3211 that is configured to manage the memory are disposed in the first storage node 321, and in this case, the first DSH 3111 is further configured to when the current active node list does not record the first computing node 311, add a label indicating that the data is not compressed to the data in order to obtain labeled data, determine whether the current active node list records the first storage node 321, and send the labeled data to the first MM 3211 when the current active node list records the first storage node 321.

In this embodiment of the present application, optionally, the first DSH 3111 is further configured to when the current active node list does not record the first storage node 321, determine whether the current active node list records the second computing node 312, where the second computing node 312 is any computing node except the first computing node 311, and send the labeled data to a second DSH 3121 in the second computing node 312 when the current active node list records the second computing node 312 such that the second DSH 3121 compresses the data to obtain the compressed data.

In this embodiment of the present application, optionally, the first DSH 3111 is further configured to send the labeled data to the first MM 3211 when the current active node list does not record the second computing node 312.

In this embodiment of the present application, optionally, the first MM 3211 is configured to receive the labeled data, acquire the data and the label from the labeled data, determine, based on the label, whether a current working status of the first storage node 321 is a busy state, and when the current working status of the first storage node 321 is not a busy state, compress the data to obtain the compressed data.

In this embodiment of the present application, optionally, the first MM 3211 is further configured to directly store the data in the memory when the current working status of the first storage node 321 is a busy state, and send, to the first DSH 3111, third information indicating that the data is not compressed.

In this embodiment of the present application, optionally, the first DSH 3111 is further configured to receive the third information, acquire the current active node list based on the third information, and send a first request to the first MM 3211 when the current active node list records the first storage node 321, where the first request is used to enable the first MM 3211 to acquire the data from the memory and compress the data to obtain the compressed data.

Persons skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a compact disc read-only memory (CD-ROM), an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine such that the instructions executed by a computer or a processor of any other programmable data processing device generate an apparatus for implementing a specific function in one or more processes in the flowcharts and/or in one or more blocks in the block diagrams.

These computer program instructions may also be stored in a computer-readable memory that can instruct the computer or any other programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device such that a series of operations and steps are performed on the computer or the other programmable device, thereby generating computer-implemented processing. Therefore, the instructions executed on the computer or the other programmable device provide steps for implementing a specific function in one or more processes in the flowcharts and/or in one or more blocks in the block diagrams.

Although some exemplary embodiments of the present disclosure have been described, persons skilled in the art can make changes and modifications to these embodiments once they learn the basic inventive concept. Therefore, the following claims are intended to be construed as to cover the exemplary embodiments and all changes and modifications falling within the scope of the present disclosure.

Obviously, persons skilled in the art can make various modifications and variations to the present disclosure without departing from the spirit and scope of the present disclosure. The present disclosure is intended to cover these modifications and variations provided that they fall within the scope of protection defined by the following claims and their equivalent technologies.

What is claimed is:

1. A data processing method, comprising:
acquiring, by a first computing node in the computing nodes, data, wherein an application program corresponding to the data is deployed in the first computing node;
adding, by the first computing node, a label indicating that the data is not compressed into the data in order to obtain labeled data when the current working status of the first computing node is a busy status; and
sending, by the first computing node, the labeled data to a first storage node in the storage nodes when the current working status of the first storage node is not a busy status.

2. The method according to claim 1, therein the method further comprises:
collecting, by a metadata controller (MDC) in a storage system, first information indicating a first current working status of each computing node in the storage system;
determining, by a corresponding distributed software header (DSH) in each computing node based on a current resource usage rate of at least one computing node hardware in the computing node in which the corresponding DSH is located, a corresponding first current working status of the computing node in which the corresponding DSH is located; and
generating the first information based on the corresponding first current working status of the computing node in which the corresponding is located,
wherein the at least one computing node hardware comprises a central processing unit (CPU), a memory, or combinations thereof,
wherein when the current resource usage rate of the at least one computing node hardware is greater than or equal to a first preset resource usage rate, the corresponding first current working status of the computing node in which the at least one computing node hardware is located is a first busy state, and
wherein when the current resource usage rate of the at least one computing node hardware is less than the first preset resource usage rate, the corresponding first current working status of the computing node in which the at least one computing node hardware is located is not the first busy state.

3. The method according to claim 1, wherein the method further comprises:
collecting, by a metadata controller (MDC) in a storage system, second information indicating a second current working status of each storage node in the storage system;
determining, by a corresponding memory manager (MM) in each storage node based on a current resource usage rate of at least one storage node hardware in the storage node in which the corresponding MM is located, a corresponding second current working status of the storage node in which the corresponding MM is located; and
generating the second information based on the corresponding second current working status of the storage node in which the corresponding MM is located,
wherein the at least one storage node hardware comprises a central processing unit (CPU), a memory, or combinations thereof,
wherein when the current resource usage rate of the at least one storage node hardware is greater than or equal to a second preset resource usage rate, the corresponding second current working status of the storage node in which the at least one storage node hardware is located is a second busy state, and
wherein when the current resource usage rate of the at least one storage node hardware is less than the second preset resource usage rate, the corresponding second current working status of the storage node in which the at least one storage node hardware is located is not the second busy state.

4. The method according to claim 2, wherein the method further comprises generating, by the MDC, a current active node list that records the current active computing node.

5. The method according to claim 1, wherein a first memory manager (MM) that is configured to manage the memory is disposed in the first storage node, and wherein sending comprises sending, by the first computing node, the labeled data to the first MM of the first storage node when the current working status of the first storage node is not a busy status according to the second information.

6. The method according to claim 1, wherein sending, by the first computing node, the labeled data to a second computing node when the current working status of the first storage node is a busy status and the current working status of the second computing node is not a busy status, wherein the second computing node is any computing node except the first computing node.

7. The method according to claim 1, wherein the method further comprises sending, by the first computing node, the labeled data to the first storage node when the current working status of the first storage node is a busy status and the current working status of a second computing node is a busy status, wherein the second computing node is any computing node except the first computing node.

8. The method according to claim 1, wherein after sending, by the first computing node, the labeled data to the first storage node, the method further comprises:
receiving, by the first storage node, the labeled data;
acquiring, by the first storage node, the data and the label from the labeled data;
determining, by the first storage node based on the label, whether the second current working status of the first storage node is a second busy state; and
compressing, by the first storage node, the data to obtain the compressed data when the second current working status of the first storage node is not a busy state.

9. The method according to claim 1, further comprising:
receiving, by the first storage node, the labeled data;
acquiring, by the first storage node, the data from the labeled data; and
compressing, by the first storage node, the data to obtain the compressed data.

10. A storage system, comprising:
N computing nodes, wherein N is a positive integer, and wherein the N computing nodes comprise a first computing node;
P storage nodes, wherein P is a positive integer, and wherein the P storage nodes comprise a first storage node; and wherein the first computing node is configured to:
acquire data when the storage system needs to compress the data, wherein an application program corresponding to the data is deployed in the first computing node;
add a label into the data to indicate that the data is not compressed, in order to obtain labeled data when the current working status of the first computing node is a busy status according to the first information; and
send the labeled data to the first storage node when the current working status of first storage node is not a busy status according to the second information.

11. The storage system according to claim 10, wherein the storage system further comprises at least one metadata controller (MDC), the at least one MDC separately coupled to the N computing nodes and separately coupled to the P storage nodes,
wherein the MDC is configured to: collect first information indicating a first current working status of each computing node;
wherein at least one distributed software header (DSH) is disposed in each computing node of the N computing nodes, and each DSH in the N computing nodes is configured to:
determine, based on a current resource usage rate of at least one computing node hardware in a corresponding computing node in which the DSH is located, a corresponding first current working status of the corresponding computing node in which the DSH is located; and
generate the first information based on the corresponding first current working status of the corresponding computing node in which the DSH is located, wherein the at least one computing node hardware comprises a central processing unit (CPU), a memory, or combinations thereof,
wherein when the current resource usage rate of the at least one computing node hardware is greater than or equal to a first preset resource usage rate, the corresponding first current working status of the corresponding computing node in which the at least one computing node hardware is located is a first busy state, and
wherein when the current resource usage rate of the at least one computing node hardware is less than the first preset resource usage rate, the corresponding first current working status of the corresponding computing node in which the at least one computing node hardware is located is not the first busy state.

12. The storage system according to claim 10, wherein the storage system further comprises at least one metadata controller (MDC), the at least one MDC separately coupled to the N computing nodes and separately coupled to the P storage nodes,
wherein the MDC is configured to: collect second information indicating a second current working status of each storage node, and
at least one memory manager (MM) is disposed in each storage node of the P storage nodes, and each MM in the P storage nodes is configured to:
determine, based on a current resource usage rate of at least one storage node hardware in a corresponding storage node in which the MM is located, a corresponding second current working status of the corresponding storage node in which the MM is located, and
generate the second information based on the corresponding second current working status of the storage node in which the MM is located, wherein the at least one storage node hardware comprises a central processing unit (CPU), a memory, or combinations thereof,
wherein when the current resource usage rate of the at least one storage node hardware is greater than or equal to a second preset resource usage rate, the corresponding second current working status of the storage node in which the at least one storage node hardware is located is a second busy state, and
wherein when the current resource usage rate of the at least one storage node hardware is less than the second preset resource usage rate, the corresponding second current working status of the storage node in which the at least one storage node hardware is located is not the second busy state.

13. The storage system according to claim 12, wherein the MDC is further configured to generate a current active node list that records the current active storage node.

14. The storage system according to claim 10, wherein the first computing node is further configured to send the labeled data to a second computing node when the current working status of first storage node is a busy status and the current working status of the second computing node is not a busy status, wherein the second computing node is any computing node of the N computing nodes except the first computing node.

15. The storage system according to claim 10, wherein the first computing node is further configured to send the labeled data to the first MM when the current working status of the first storage node is a busy status and the current working status of the second computing node is a busy status, wherein the second computing node is any computing node except the first computing node.

16. The storage system according to claim 10, wherein the first storage node is configured to:
receive the labeled data;
acquire the data and the label from the labeled data; and
compress the data to obtain the compressed data when a second current working status of the first storage node is not a busy state.

17. The storage system according to claim 10, wherein the first storage node is configured to:
receive the labeled data;
acquire the data from the labeled data; and
compress the data to obtain the compressed data.

18. A data processing method, comprising:
acquiring., by a first computing node in the computing nodes, data, wherein an application program corresponding to the data is deployed in the first computing node;
adding, by the first computing node, a label indicating that the data is not compressed into the data in order to obtain labeled data when the first computing node is in a busy status according to the information; and
sending, by the first computing node, the labeled data to a second computing node in the computing nodes when the current working status of the second computing node is not a busy status according to the information, wherein the second computing node is any computing node except the first computing node.

19. The method according to claim 18, further comprising:
receiving, by the second computing node, the labeled data;
acquiring, by the second computing node, the data from the labeled data; and
compressing, by the second computing node, the data to obtain the compressed data.

20. A storage system, comprising:
N computing nodes, wherein N is a positive integer and the N computing nodes comprise a first computing node; and
wherein the first computing node is configured to:
  acquire data when the storage system needs to compress the data, wherein an application program corresponding to the data is deployed in the first computing node;
  add a label into the data to indicate that the data is not compressed, in order to obtain labeled data when the current working status of the first computing node is a busy status according to the information; and
  send the labeled data to a second computing node when the current working status of the second computing node is not a busy status according to the information, wherein the second computing node is any computing node except the first computing node.

21. The storage system according to claim 20, wherein the second computing node is further configured to:
  receive the labeled data;
  acquire the data from the labeled data;
  compress the data to obtain the compressed data.

\* \* \* \* \*

UNITED STATES PATENT AND TRADEMARK OFFICE
CERTIFICATE OF CORRECTION

PATENT NO.        : 10,055,134 B2
APPLICATION NO.   : 15/146076
DATED             : August 21, 2018
INVENTOR(S)       : Lizhen Li It is certified that error appears in the above-identified patent and that said Letters Patent is hereby corrected as shown below:

On the Title Page

Item (30), Line 1: "201310549672" should read "201310549672.3"

Item (56), U.S. PATENT DOCUMENTS, Line 5: "Lhang" should read "Zhang"

In the Claims

Column 17, Line 21: "therein" should read "wherein"

Column 17, Line 36: insert --DSH-- after "corresponding"

Column 20, Line 46: delete "." after "acquiring"

Signed and Sealed this
Second Day of October, 2018

Andrei Iancu
*Director of the United States Patent and Trademark Office*